United States Patent [19]

Wagner

[11] Patent Number: 4,968,986
[45] Date of Patent: Nov. 6, 1990

[54] WIDE BANDWIDTH ANALOG-TO-DIGITAL CONVERTER AND METHOD

[75] Inventor: T. C. Gordon Wagner, Rockville, Md.

[73] Assignee: Ideas, Inc., Columbia, Md.

[21] Appl. No.: 254,034

[22] Filed: Oct. 6, 1988

[51] Int. Cl.⁵ .................................................. H03M 3/00
[52] U.S. Cl. .......................................................... 341/111
[58] Field of Search ................................. 341/111, 155

[56] References Cited

U.S. PATENT DOCUMENTS

| | | | |
|---|---|---|---|
| 3,624,641 | 11/1971 | Brennan | 341/111 |
| 3,735,391 | 5/1973 | Games et al. | 341/116 |
| 3,745,559 | 7/1973 | Mattern | 341/111 |
| 3,761,916 | 9/1973 | Schenck | 341/111 |
| 4,069,479 | 1/1978 | Carpenter et al. | |
| 4,075,698 | 2/1978 | Lode | 341/111 |
| 4,107,668 | 8/1978 | Henry | 341/111 |
| 4,168,470 | 9/1979 | Covitt | |
| 4,364,029 | 12/1982 | Villa | |
| 4,419,659 | 12/1983 | Sloane | |
| 4,571,574 | 2/1986 | Krynicki | |
| 4,611,194 | 9/1986 | Konig et al. | |
| 4,647,968 | 3/1987 | Willis | |
| 4,694,276 | 9/1987 | Rastegar | |

*Primary Examiner*—William M. Shoop, Jr.
*Assistant Examiner*—Sharon D. Logan
*Attorney, Agent, or Firm*—Jim Zegeer

[57] ABSTRACT

A wide bandwidth analog-to-digital converter and method. The input analog signal is supplied to a plurality (N) of parallel channels, each of which includes a modulator for modulating the incoming analog signal in each channel with a different time phased sampling signal. A filter having bandwidths which reject the sum product of the modulator and all frequencies above a predetermined level and passes the filtered signal directly to an analog-to-digital converter and a sampling signal supplied to these converters are at a rate which is predetermined fraction (depending on the number of channels) of the normal rate.

8 Claims, 3 Drawing Sheets

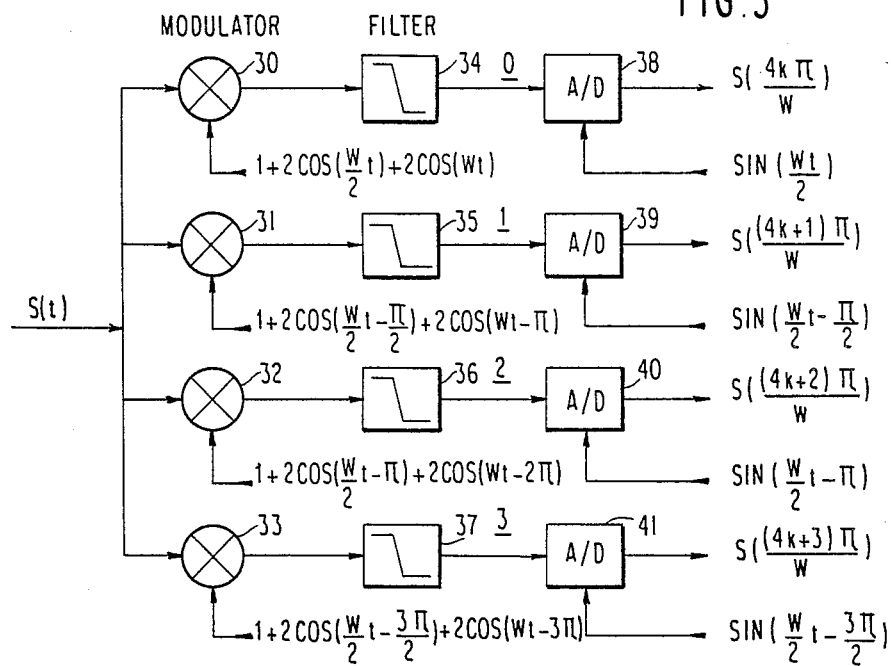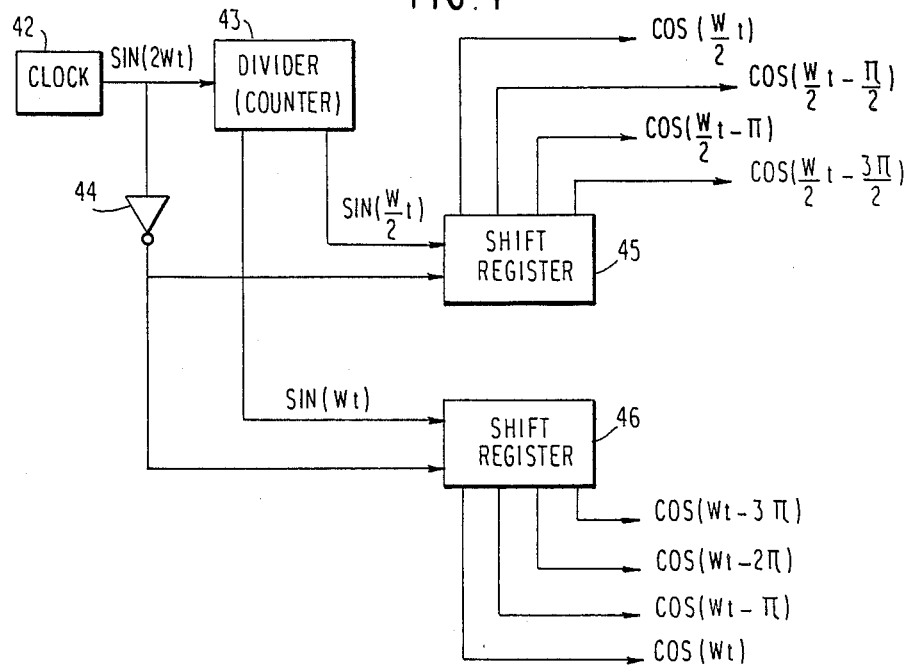

WIDE BANDWIDTH ANALOG-TO-DIGITAL CONVERTER AND METHOD

BACKGROUND AND BRIEF DESCRIPTION OF THE INVENTION

Parameters that limit the performance of analog to digital converters (A/D) are, the maximum digitizing rate, the effective aperture width of the samples, and the settling time of comparators. Although it is easy to extend the digitizing rate by multiplexing several A/D converters in time, this does not remove the requirements on speed which are imposed by the bandwidth of the signal being digitized.

The two most popular at the present time are: the successive approximation type, and the parallel or flash converter type, the half-flash converter, which combines both successive approximation and flash methods. In a successive approximation converter, a voltage is generated from zero to maximum, by an internal digital-to-analog converter and each successive increment compared with the converter input voltage until a match is reached, the setting of the DA converter then represents the value of the input voltage. A flash converter consists essentially of a voltage divider resistor ladder with fixed tap positions defining resistor segments corresponding to the desired resolution of the converter. Accordingly, a converter of "n" bit resolution would require $2^{n+1}$ resistor segments. Each tap is connected to a comparator of its own, and accordingly $2^{n}-1$ comparators are needed. Each comparator compares its voltage divider voltage with the converter's input voltage. The line of comparators respond according to a "thermometer code", those comparators with thresholds below the converter input voltage, turn on, while those with thresholds above the input voltage remain off. The output of all the comparators is then translated by an encoder into a binary or decimal number. A typical commercial flash computer is Honeywell, Inc.'s HADC 77100 flash A/D converter. In a half-flash converter, the output of a first flash-converter of low resolution is sued to generate a voltage by means of an internal digital-to-analog converter, this voltage is then subtracted from the input voltage to provide a new voltage representing the lower resolution portion of the input voltage, which is then fed into a second flash-converter unit and both results combined by appropriate encoder units. Here speed is sacrificed for reduction in total number of comparators, however the total circuit is no longer monotonic. It can be seen that typically a successive approximation method is very slow as it does require $2^{n}-1$ successive operations, and a flash-converter is complex as it requires $2^{n}-1$ comparators. By way of example, an 8 bit converter would require 255 comparators, since it increases geometrically. See Krynicki U.S. Pat. No. 4,571,574 from which the preceding was taken. In some commercial flash converter units there is a decreasing performance with increase in bandwidth. Covitt U.S. Pat. No. 4,168,470 discloses a two bit A/D converter in which the input analog signal is supplied to a pair of channels, each channel having a modulator, a low pass filter and a full wave rectifier in each channel to supply a pair of A/D converters to provide a two bit A/D converter. In Konig et al. U.S. Pat. No. 4,611,194 an analog data pulse is applied in parallel to plurality of low speed A/D converters and to one or more level detectors, each of which has a preset threshold so that when the signal crosses the reference threshold a strobe is produced and applied to a delay circuit which then applies the strobe (after a predetermined delay) to its related A/D converter. The A/D converters sample the analog data in response to its associated delayed strobe to provide a digital value of the sample. The A/D digital outputs are multiplexed and compared to produce the output.

The basic objective of this invention is to provide an improved wide bandwidth A/D converter. A further object of this invention is to provide a method and apparatus for making it possible to multiply the digitizing rate of an A/D by an integer and at the same time to reduce the requirements upon the speed of the A/D converters by the same integer. The A/D converter according to this invention automatically demultiplexes the high speed digital samples into several low speed channels for recording or analysis. A further feature of the invention is that balanced modulators are not required because the bandwidths of the low pass filters reject the sum and products and modulation frequencies.

BRIEF DESCRIPTION OF THE DRAWINGS

The above and other objects, advantages and features of the invention will become more apparent when considered with the following specification and accompanying drawings wherein:

FIG. 3 is a block diagram of a further embodiment of the invention, FIG. 4 illustrates a circuit for generating the modulating signals and required time delays for the circuit shown in FIG. 3.

DETAILED DESCRIPTION OF THE INVENTION

Figure 1:
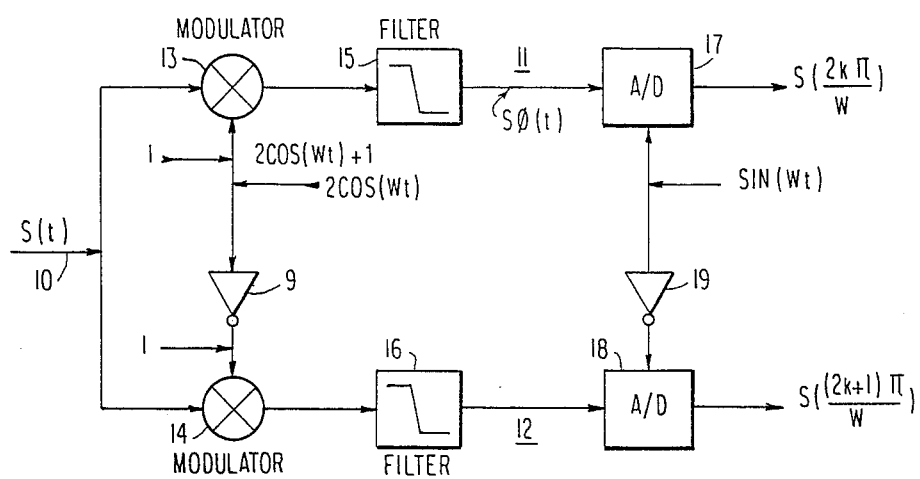
FIG. 1 is a block diagram of a circuit incorporating the invention.

In order to be able to digitize a signal usefully, the signal must have a limited bandwidth. If the bandwidth of the signal is F, then the digitizing rate must be at least 2F. A second limitation is that the aperture width of the converter must be small enough so that the signal is not changing significantly during the sample time.

If the maximum bandwidth of the signal (in radians per second) is denoted by W and if the signal function of time is denoted by S(t), then with a spectral distribution function A(w), where W denotes the frequency in radians per second, and where A(w) is a complex number representing the spectral distribution, then the signal may be represented as:

$$S(t) = \int_0^W A(w)e^{jwt} dw \qquad (1)$$

The samples are determined by the values of $S(t_k)$ where:

$$t_k = k\pi/w \qquad (2).$$

In accordance with this invention the signal on input 10 is processed into a plurality of similar channels 11 and 12, each channel, having modulators 13, 14 for modulating the signal as follows: In the upper channel 11 the signal, (S(t), is one input of modulator 13 and the other input is a modulating signal given by:

$$2 \cos Wt + 1 \tag{3}$$

The output of the modulator 11 is designed to produce a signal given by:

$$U_0(t) = [2 \cos Wt + 1]S(t) = [e^{jWt} + e^{-jWt}]S(t) + S(t) \tag{4}$$

The above signal (4) is now passed through a low pass filter 15 which effectively attenuates all frequencies above W/2. This filter is not required to have an extremely sharp cut-off characteristic but it is designed so that its attenuation function, T(w), meets the following conditions: If the low pass filter had no phase shift, the condition on T(w) would simply be that $T(w) + T(w-W) = 1$. In this case it would follow that $T(W/2)$ would equal ½. If the transfer function includes, as a function of frequency, a phase shift a(w) then the condition becomes:

$$T(w) + T(w - W) = e^{ja(w)} \tag{5}$$

In other words, the sum of the transfer function and its complement is merely a phase shift. It may be noted that, in the vicinity of W/2, the signs of a(w−W) and a(w) are opposite. The simplest realization of the condition of equation (5) is obtained when the phase shift at W/2 is an integral multiple of 180 degrees. If this is not the case, the equivalent result can be achieved by phase shift of the modulation equal to −2 times the filter phase shift at W/2. The condition of equation (5) is easily achievable with practical filters. The output of the filter 15 is:

$$S\phi(t) = \int_0^W A(w)[T(w)e^{jwt} + T(w-W)e^{j(w-W)t}]dw \tag{6}$$

The output of the filter 15 becomes the input of an A/D converter 17, but this converter 17 is sampling and digitizing at one half the full rate at times given by even values of k. At these times $e^{-jWt_k} = 1$, and:

$$T(w)e^{jwt_k} + T(w - W)e^{j(w-W)t_k} = \tag{7}$$

$$[T(w) + T(w - W)]e^{jwt_k}, \; k \text{ even}$$

$$S\phi(t_K) = \int_0^W A(w) e^{j[wt_k + a(w)]} dw, \; k \text{ even} \tag{8}$$

Except for a phase shift and the equivalent time delay, samples at even $t_k$ are the same as the original even samples given by equation (1). Thus half of the original samples are obtained as the output of one A/D, but this operates at half the rate and with a signal of half the original bandwidth.

It should be noted that although the spectrum of SO(t) only extends to approximately W/2, the limits of the integral in equation (5) are from 0 to W and the A(w) encompasses all of the original signal.

The modulator output is designed to be linear with respect to S(t), but it is permissible to have components when represent products of harmonics of cos(Wt) with S(t) because these components will all lie above the cut-off frequency of the filter. In particular, the modulating signal may be chosen to be a squarewave or a pulse train.

The lower channel 12 is similar to the upper channel 11 except that phase of the modulating signal is delayed by $\pi$ radians by inverter 9 and the output of the lower modulator 14 is given by:

$$U_1(t) = [1 - 2 \cos Wt]S(t) \tag{9}$$

This signal is passed through the same kind of filter 16 as the filter of the upper channel, but now another A/D converter 18 samples this output at times given by the odd values of k. At these times $e^{jWt_k} = -1$.

It is seen that the total digitizing rate remains the same as that required by the bandwidth of the signal but each A/D converter 17, 18 operates at one half the rate and because of the half bandwidth filters at the input of each, the requirement on the aperture width and speed is also reduced by a factor of 2.

Figure 2:
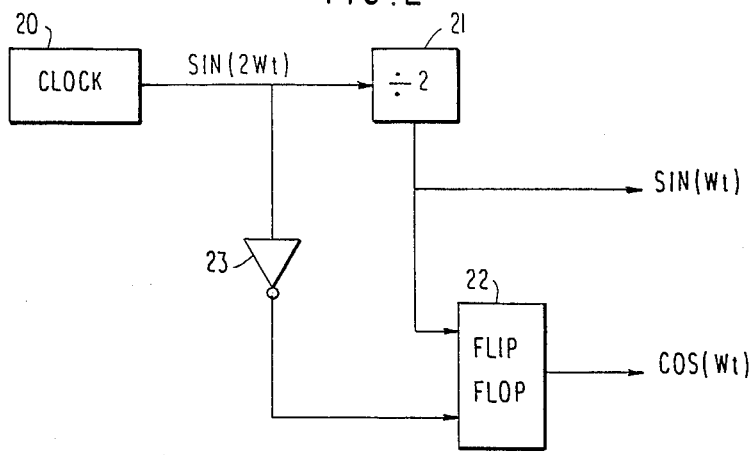
FIG. 2 illustrates a circuit for generating the modulation and required time delays for use with the circuit shown in FIG. 1.

One method of generating the modulations and the required time delays is shown in FIG. 2. A signal SIN (2Wt) from clock 20 is applied to divider 21 to produce the sampling signal SIN (Wt) and an input to flip-flop 22. A second input to flip-flop 22 is received from the clock 20 via inverter 23. Many other methods might be employed for the same purpose.

As stated earlier, in order to obtain useful samples of the signal whose bandwidth is F, the digitizing rate must be at least 2F; this means that A(w) must effectively vanish when w>W. Even though the transfer function of the filters, T(w), does not vanish for w>W/2, no error is introduced, for the validity of the samples as given by equation (7) only depends upon A(w) vanishing for w>W. Nevertheless, the speed requirements on each A/D are only those imposed by the filter function T(w).

The process may be continued as each of the previous channels may be split into two and thus four separate A/D converters can be employed operating at one fourth the rate and with correspondingly reduced aperture width and speed requirements. In this case there would be 4 A/D converters each sampling at ¼ the nominal rate and each having an input at ¼ of the full bandwidth of the signal. In addition to the four A/D converters, six modulators and six filters would be required. In this method of extension, the number of A/D, N, would be a power of 2 and the number of filters and modulators would be 2N−2.

Another modification of the general principle described is illustrated in FIG. 3. In this case the factor by which the digitizing rate and speed requirements are modified can be any even integer and the number of modulators, filters, and A/D converters is merely multiplied by the same integer.

To illustrate a system which will sample at ¼ the rate with ¼ the speed requirements refer to FIG. 3. If the signal is the input of 4 modulators 30, 31, 32, 33, each with a modulating signal specified by:

$$U_p(t) = [1 + 2 \cos [W(t-b)/2] + 2 \cos W(t-b)]S(t)$$
$$\text{where } p = 0, 1, 2, 3 \text{ and where } b = p\pi/W \tag{10}$$

The channels may be also identified by p as 0, 1, 2, or 3. Each modulator output now is the input of low pass filters 34, 35, 36, 37 with a bandwidth of W/4. Each filter output is sampled by respective A/D converters 38, 39, 40, 41 at ¼ the nominal rate at times given by:

$$t_k = (4k+p)\pi/W \tag{11}$$

The output of a filter of channel p may be written as:

$$S_p(t) = \int_0^W A(w)\,[T(w)e^{jwt} + T(w - W/2)e^{j(w-W/2)t+jWb/2} + T(w - W)e^{j(w-W)t+jWb}]\,dw \tag{12}$$

The transfer function, T(w), represents a low pass filter with a cut-off at W/4. Thus terms in equation (12) represent respectively the contribution of the signal, S(t) in the bands 0 to W/4, W/4 to 3W/4, and 3W/4 to W. These arise from the respective terms of the modulation. The considerations at the edges of the response, which occur at W/4 are the same as previously discussed. So that:

$$T(w) + T(w-W/2) = e^{ja(w)} \text{ and consequently}$$
$$T(w-W/2) + T(w-W) = e^{ja(w-W/2)} \tag{13}$$

There are two degrees of freedom in the addition of added phase shifts of the modulation, so that the transition conditions can be met. With b chosen as in equation (10), $e^{-jW(t_k-b)/2}$ and $e^{-jW(t_k-b)}$ are both equal to 1 at the sample times given by equation (11). It follows that the combined samples of the four channels are the same as samples of the input signal. Of course, the sample times of each channel are separated from the next channel by /W.

Many different methods may be employed to generate the modulating signals and to implement the required time delays. FIG. 4 illustrates one method to accomplish these requirements. Clock 42, divider or counter 43 and inverter 44 perform the same function as in FIG. 2. Shift registers 45 and 46 are employed to generate the time delays; obviously other techniques could accomplish the same result.

Figure 5:
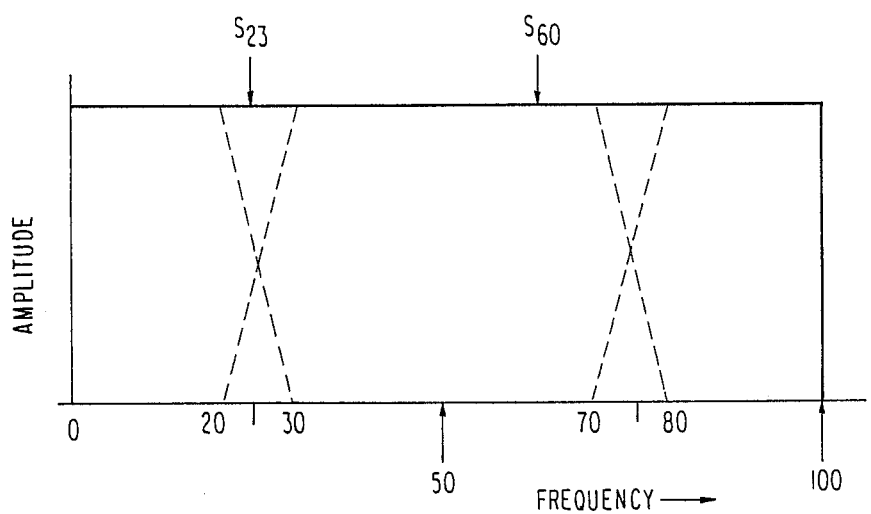
FIG. 5 is a graph which is used to explain the operation of the system.
Figure 6:
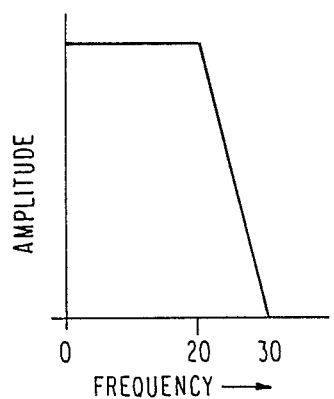
FIG. 6 is an illustration of an approximate filter response.

To explain more fully the operation of the system refer to FIG. 5 and FIG. 6. Suppose that the signal to be digitized as a spectrum extending from 0 to 100 MHz. For the purpose of illustration we approximate the filter response as shown in FIG. 6. The response is flat to 20 MHz and then falls linearly to 30 MHz. Actual filters will have a more complicated response. The effect of the filter is to accept various portions of the original signal which may be translated or folded in frequency due to the modulation.

As a further example, consider a signal component at 60 MHz. This will be modulated with the 50 MHz component of the modulation and appear in all four filters at 10 MHz, but with 4 different phases. Each A/D converter will produce samples which represent the 60 MHz component of the original signal. As a further illustration, consider a signal component at 23 MHz. This will appear in the filters as two components; one at 23 MHz (due to the 1 in the modulation); and the other at 27 MHz due to the 50 MHz component of the modulation. The 27 MHz will, of course, have different phase angles in each of the filters. Since the 23 MHz and the 27 MHz lie on the skirt of the filters, they will be subject to attenuations of 0.7 and 0.3 respectively, but the sum of the two samples will add to unity and represent the value of the 23 MHz component of the original signal sampled at 5 ns intervals.

In many applications it is desired to de-multiplex the high speed digital samples into several lower speed channels for recording or analysis. The system described provides an output in this form automatically.

One outstanding feature of all the systems discussed is that the chosen bandwidths of the low pass filters are such that the sum products and the modulation frequencies are rejected. This eliminates the necessity that balanced modulators be employed.

It will be clear to those skilled in the art that further embodiments of the present invention may be made by those skilled in the art without departing from the spirit and scope of the present invention as set forth in the claims appended hereto.

What is claimed is:

1. A wide bandwidth analog-to-digital apparatus comprising:
   input means for receiving an analog signal to be converted,
   N number of parallel channels, each channel including:
   means for connecting the channel to said input means,
   a modulator,
   a filter means connected to said modulator,
   an analog to digital converter operated at a rate of 1/N,
   means connecting the signal from said filter means to said analog-to-digital converter,
   a source of modulating signals for supplying modulating signals to each of said modulators in a phase displaced relation, respectively, said filter means having a bandwidth which rejects the sum products of said analog signal and said modulating signals, and
   a source of sampling signals for supplying synchronized sampling signals in said phase displaced relation to respective ones of said analog-to-digital converters.

2. The wide bandwidth analog-to-digital apparatus defined in claim 1, wherein said modulating signals are squarewaves.

3. The wide bandwidth analog-to-digital apparatus defined in claim 1 including a common clock signal source and wherein said source of modulating signals and said source of sampling signals are connected to said common clock signal source.

4. A wide bandwidth analog-to-digital signal apparatus comprising:
   input means for receiving a wide bandwidth analog signal to be converted to a digital signal,
   a plurality (N) of parallel channels, each channel including:
   (a) an analog signal modulator having as one input said wide bandwidth analog signal and as a second input, a modulating signal,
   (b) a filter having a predetermined bandwidth connected to said modulator,
   (c) an analog-to-digital converter connected to said filter operated at a sampling rate of 1/N, and
   a source of modulating signals for supplying a modulating signal to each of said modulators in phased displaced relation relative to each other, there being N phases of modulating signals, one phase for each channel, respectively, and a source of sampling signals for supplying synchronized sampling signals in phase displaced relation to respective ones of said analog-to-digital converters, there being N phases of sampling signals, one phase for each analog-to-digital converter, respectively.

5. The analog-to-digital apparatus defined in claim 4 wherein said modulating signals are square waves.

6. The wide bandwidth analog-to-digital apparatus defined in claim 4 including a common clock signal source and wherein said source of modulating signals and said source of sampling signals are connected to said common clock signal source.

7. A method of converting wide bandwidth analog signal to digital signal comprising:
receiving an analog signal to be converted,
providing N number of parallel channels, each channel including a modulator connected to a filter, which, in turn, is connected to an analog-to-digital converter operated at a rate of 1/N,
supplying modulating signals to each of said modulators in phase displaced relation, there being N phases of modulating signals, one phase for each channel, respectively, and
providing sampling signals for supplying synchronized sampling signals in phase displaced relation to respective ones of said analog-to-digital converters, there being N phases of sampling signals, one phase for each analog-to-digital converter, respectively.

8. The method defined in claim 7 wherein said modulating signals are square waves.

* * * * *